(12) United States Patent
Zhu

(10) Patent No.: US 9,601,566 B2
(45) Date of Patent: Mar. 21, 2017

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/439,514

(22) PCT Filed: Nov. 19, 2012

(86) PCT No.: PCT/CN2012/084817
§ 371 (c)(1),
(2) Date: Apr. 29, 2015

(87) PCT Pub. No.: WO2014/071652
PCT Pub. Date: May 15, 2014

(65) Prior Publication Data
US 2015/0318349 A1    Nov. 5, 2015

(30) Foreign Application Priority Data

Nov. 9, 2012   (CN) .......................... 2012 1 0447259

(51) Int. Cl.
*H01L 29/06* (2006.01)
*H01L 29/78* (2006.01)
(Continued)

(52) U.S. Cl.
CPC .......... *H01L 29/0649* (2013.01); *H01L 21/28* (2013.01); *H01L 21/30604* (2013.01);
(Continued)

(58) Field of Classification Search
CPC .................................................. H01L 29/0649
See application file for complete search history.

(56) References Cited

U.S. PATENT DOCUMENTS 7,939,889 B2 * 5/2011 Yu ...................... H01L 29/66795
257/347
8,283,653 B2   10/2012 Pillarisetty et al.
(Continued)

FOREIGN PATENT DOCUMENTS

CN    101203947 A    6/2008
CN    101228634 A    7/2008
(Continued)

*Primary Examiner* — Cuong Q Nguyen
*Assistant Examiner* — Nishath Yasmeen
(74) *Attorney, Agent, or Firm* — Christensen, Fonder, Dardi & Herbert PLLC

(57) ABSTRACT

A method for manufacturing a fin structure. The method includes: forming a first semiconductor layer and a second semiconductor layer sequentially on a substrate; patterning the second and first semiconductor layers to form an initial fin; selectively etching the first semiconductor layer of the initial fin so that the first semiconductor layer has a lateral recess; forming an isolation layer having a portion that fills the lateral recess, wherein the isolation layer, except the portion that fills the lateral recess, has a top surface lower than a top surface of the first semiconductor layer but higher than a bottom surface of the first semiconductor layer, and thus defines a fin above the isolation layer; and forming a gate stack intersecting the fin on the isolation layer.

6 Claims, 9 Drawing Sheets

(51) Int. Cl.
    *H01L 29/66*     (2006.01)
    *H01L 29/40*     (2006.01)
    *H01L 21/28*     (2006.01)
    *H01L 21/306*     (2006.01)
    *H01L 21/8238*     (2006.01)
    *H01L 27/092*     (2006.01)

(52) U.S. Cl.
    CPC .. *H01L 21/823821* (2013.01); *H01L 27/0924* (2013.01); *H01L 29/401* (2013.01); *H01L 29/66795* (2013.01); *H01L 29/785* (2013.01)

(56) References Cited

U.S. PATENT DOCUMENTS

| | | | |
|---|---|---|---|
| 8,440,517 B2 | 5/2013 | Lin et al. | |
| 2009/0008705 A1* | 1/2009 | Zhu | H01L 29/66795 257/327 |
| 2011/0133292 A1* | 6/2011 | Lee | H01L 21/823431 257/401 |

FOREIGN PATENT DOCUMENTS

| | | |
|---|---|---|
| CN | 102446974 A | 5/2012 |
| CN | 102651320 A | 8/2012 |
| CN | 102656699 A | 9/2012 |

\* cited by examiner (a)

(b)

SEMICONDUCTOR DEVICE AND METHOD FOR MANUFACTURING THE SAME

CROSS-REFERENCE TO RELATED APPLICATIONS

This application is a national phase application of PCT Application No. PCT/CN2012/084817, entitled "Semiconductor Device and Method for Manufacturing the Same," filed on Nov. 19, 2012, which claims priority to the Chinese Patent Application No. 201210447259.1, filed on Nov. 9, 2012, both of which are incorporated herein by reference in their entireties.

TECHNICAL FIELD

The present disclosure relates to semiconductor technology, and particularly to semiconductor devices and methods for manufacturing the same.

BACKGROUND

Short channel effects are getting more significant as planar semiconductor devices are increasingly being scaled down. To this end, three-dimensional (3D) semiconductor devices, such as Fin Field Effect Transistors (FinFETs), have been proposed. Generally, a FinFET includes a fin formed vertically on a substrate and a gate stack intersecting the fin. As such, a channel is formed in the fin, and has a width defined basically by a height of the fin. Unfortunately, it is difficult to control fins formed on a wafer to have the same height during manufacture of an integrated circuit (IC), resulting in inconsistency in performance of devices across the wafer.

On the other hand, a parasitic capacitance is formed at the bottom of the fin due to dielectric between the gate and the body. If the parasitic capacitance is too large, the response time of the device will become too long.

SUMMARY OF THE DISCLOSURE

The present disclosure aims to provide, among others, a semiconductor device and a method for manufacturing the same.

According to an aspect of the present disclosure, there is provided a method for manufacturing a semiconductor device, comprising: forming a first semiconductor layer and a second semiconductor layer sequentially on a substrate; patterning the second and first semiconductor layers to form an initial fin; selectively etching the first semiconductor layer of the initial fin so that the first semiconductor layer has a lateral recess; forming an isolation layer having a portion that fills the lateral recess, wherein the isolation layer, except the portion that fills the lateral recess, has a top surface lower than a top surface of the first semiconductor layer but higher than a bottom surface of the first semiconductor layer, and thus defines a fin above the isolation layer; and forming a gate stack intersecting the fin on the isolation layer.

According to another aspect of the present disclosure, there is provided a semiconductor device, comprising: a substrate; patterned first and second semiconductor layers sequentially formed on a substrate, wherein the first semiconductor layer has a lateral recess relative to the second semiconductor layer; an isolation layer formed on the substrate, having a portion that fills the lateral recess, wherein the isolation layer, except the portion that fills the lateral recess, has a top surface lower than a top surface of the first semiconductor layer but higher than a bottom surface of the first semiconductor layer, and thus defines a fin above the isolation layer; and a gate stack formed on the isolation layer and intersecting the fin.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
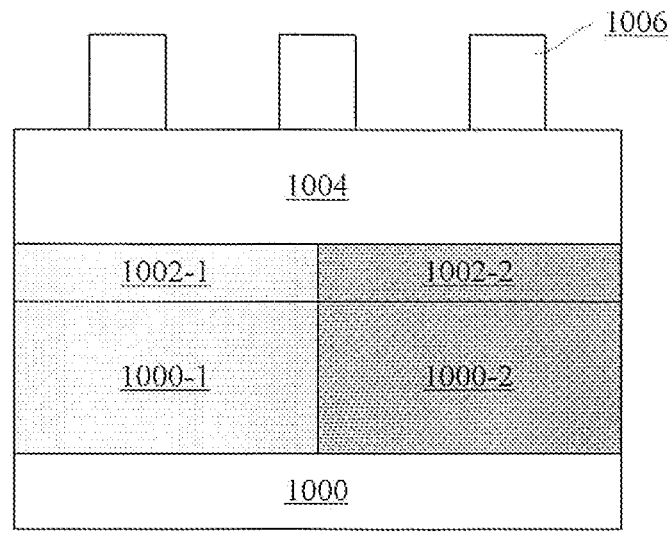
FIGS. 1 to 13 are schematic diagrams showing a process for manufacturing a semiconductor device according to an embodiment of the present disclosure.

Hereinafter, the technology disclosed herein is described with reference to embodiments thereof shown in the attached drawings. However, it should be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, at least one semiconductor layer may be formed on a substrate by, for example, epitaxy. As such, in order to form fins having the same height during patterning the fins by, for example, etching, a depth by which the etching is performed into the substrate may be reduced as compared with the conventional technology (the depth may even be reduced to zero; in this case, the fins are formed entirely by the at least one semiconductor layer), and thus it is relatively easier to control the etching depth to be consistent. Further, it is relatively easier to control the epitaxial layer to be uniform in thickness. As a result, it is possible to improve uniformity in thickness for the finally-formed fins.

In a preferable embodiment, the at least one semiconductor layer includes two or more semiconductor layers, among which adjacent semiconductor layers may have etching selectivity with respect to each other. Therefore, it is possible to selectively etch each of the semiconductor layers. After forming the fin, one (or more) of the semiconductor layers may be selectively etched, and thus narrowed (recessed) in a lateral direction. Then, an isolation layer may be formed on the substrate. The isolation layer may have a portion that fills the narrowed (recessed) part(s) of the semiconductor layer(s), but still make a portion of the narrowed (recessed) one (or more) layer protrude (relative to a top surface of the isolation layer). Therefore, the narrowed (recessed) one (or more) layer is located at the bottom of the finally-form fin (a portion of the initially-formed fin beneath the one or more layers is surrounded by the isolation layer, and thus does not act as a true fin where a channel is to be formed).

In this way, at the bottom of the finally-formed fin, dielectric between a subsequently-formed gate and the fin is relatively thick due to the narrowed (recessed) part, and thus a resultant parasitic capacitance is relatively small.

According to an embodiment of the present disclosure, the isolation layer may be formed by depositing a dielectric layer on the substrate and then etching it back. The dielectric layer may substantially cover the initially-formed fin, and a portion of the dielectric layer on top of the initial fin may have a thickness sufficiently less than that of a portion of the dielectric layer on the substrate. For example, the portion of the dielectric layer on top of the initial fin may have a thickness less than ⅓, preferably ¼, of the thickness of the portion of the dielectric layer on the substrate. This may be implemented by, for example, High Density Plasma (HDP) deposition. In case of forming a plurality of initial fins, a portion of the dielectric layer on top of each of the initial fins may have a thickness less than half of a spacing between the fin and its neighboring fin. As such, an etching depth may be reduced in the subsequent back-etching, and thus accuracy for controlling the etching may be improved.

The present disclosure may be presented in various forms, and some examples thereof will be described hereafter.

As shown in FIG. 1, a substrate 1000 is provided. The substrate 1000 may comprise any suitable substrate in various forms, for example, but not limited to, bulk semiconductor substrate, such as bulk Si substrate, Semiconductor On Insulator (SOI) substrate, SiGe substrate and the like. In the following, a bulk Si substrate is described by way of example for convenience of description.

An n-type well 1000-1 and a p-type well 1000-2 may be formed in the substrate 1000, so that a p-type device and an n-type device may be formed later therein, respectively. For example, the n-type well 1000-1 may be formed by implanting n-type impurities (such as P or As) into the substrate 1000, and the p-type well 1000-2 may be formed by implanting p-type impurities (such as B) into the substrate 1000. If required, annealing may be performed after the implantation. To those skilled in the art, the n-type and p-type wells may be formed in various methods, and detailed descriptions thereof will be omitted here.

It is to be noted that a process of forming complementary devices in the respective n-type and p-type wells will be described below, but the present disclosure is not limited thereto. The present disclosure is also applicable to a non-complementary process, for example. Further, some of the following processes related to the complementary devices may be not necessary in some implementations.

A first semiconductor layer 1002 may be formed on the substrate 1000 by, for example, epitaxy. In an example, the first semiconductor layer 1002 may comprise SiGe (wherein Ge may have an atomic percentage of about 5-20%), with a thickness of about 10-50 nm. The first semiconductor layer may be doped in-situ while being grown, for example, into p-type by using B. The first semiconductor layer may have a doping concentration higher than that of the underlying p-type well, for example, $1E18$-$2E19$ cm$^{-3}$. In an example, the first semiconductor layer 1002 of p-type may be implanted with C in order to reduce B diffusion.

A portion of the first semiconductor layer on the p-type well may be shielded by photoresist (not shown), and a portion of the first semiconductor layer on the n-type well may be implanted with n-type impurities, such as As or P, and thus converted into n-type, with a doping concentration higher than that of the underlying n-type well, for example, $2E18$-$4E19$ cm$^{-3}$. The photoresist may be then removed. As such, a first n-type semiconductor layer 1002-1 and a first p-type semiconductor layer 1002-2 are formed.

Next, a second semiconductor layer 1004 may be formed on the first semiconductor layer 1002 (including 1002-1 and 1002-2) by, for example, epitaxy. The second semiconductor layer 1004 may include Si, with a thickness of about 20-100 nm.

The formed second semiconductor layer 1004, the first semiconductor layer 1002 and the substrate may be then patterned to form initial fins. For example, this can be done as follows. In particular, photoresist 1006 may be formed and then patterned as designed on the second semiconductor layer 1004. The photoresist 1006 is generally patterned into a series of parallel equispaced lines. Then, as shown in FIG. 2, the second semiconductor layer 1004, the first semiconductor layer 1002 and the substrate may be sequentially selectively etched by, for example, Reactive Ion Etching (RIE), with the photoresist 1006 as mask, thereby forming the initial fins.

Figure 3:
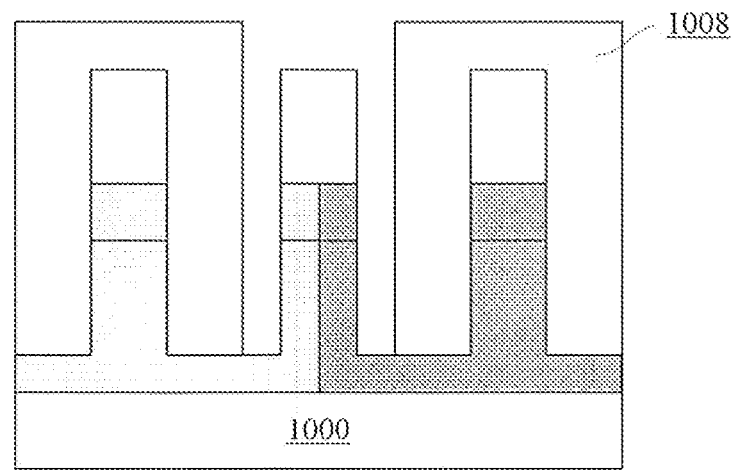

In case of the complementary process, an isolation may be formed between the n-type and p-type regions as shown in FIG. 3. In particular, photoresist 1008 may be formed on the substrate, and patterned to expose a region around an interface between the n-type and p-type regions. Then, portions of the second and first semiconductor layers existing in this region are selectively etched by, for example, RIE. The substrate may be further selectively etched by, for example, RIE. As such, an isolation zone is formed between the n-type and p-type regions, and may be subsequently filled with a dielectric layer. Then, the photoresist 1008 may be removed.

Figure 2:
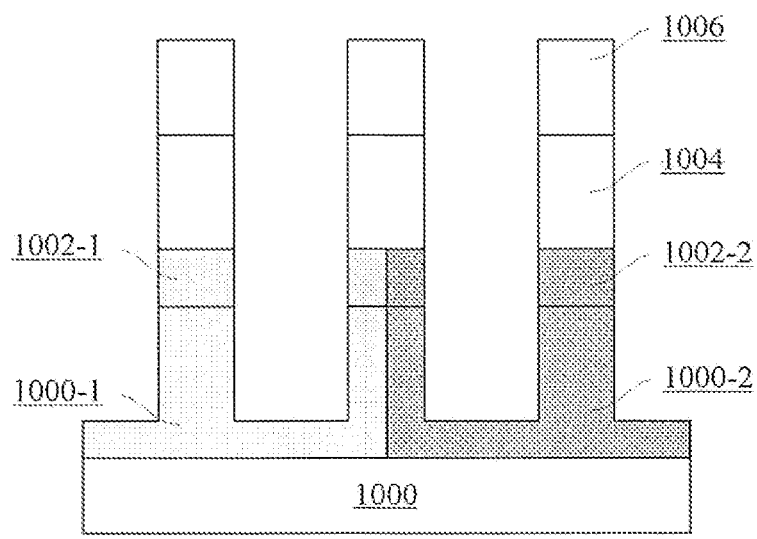

It can be seen that in the process of FIG. 2, the etching for forming the original fins is performed into the substrate 1000. Then, with the process of FIG. 3, a contact area between the p-type and n-type wells (i.e., an area of a resultant pn junction) may be made small. However, the present disclosure is not limited thereto. For example, in the non-complementary-process or in a local region of devices of a single type (p-type or n-type), the etching of the first semiconductor layer 1002 as described above in conjunction with FIG. 2 may stop on the substrate 1000, and it is not necessary to further etch the substrate 1000; and the process of FIG. 3 may be performed but not necessary. Trenches (between the initial fins) formed by the etching may have a shape different from the regular rectangular shape as shown in FIG. 2, such as a tapered shape narrowed from top down. In addition, the positions and number of the formed fins are not limited to the example as shown in FIG. 2.

Figure 4:
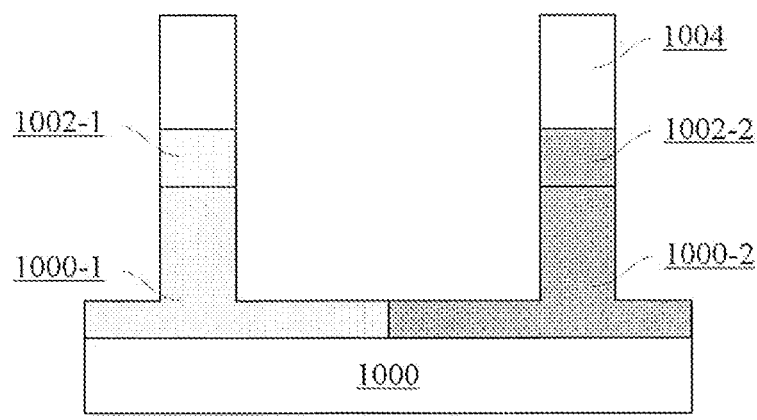

In the example of FIG. 2, an initial fin is also formed at the interface between the n-type well 1000-1 and the p-type well 1000-2. The fin is then removed by the isolation forming process of FIG. 3, resulting in the structure shown in FIG. 4.

Figure 5:
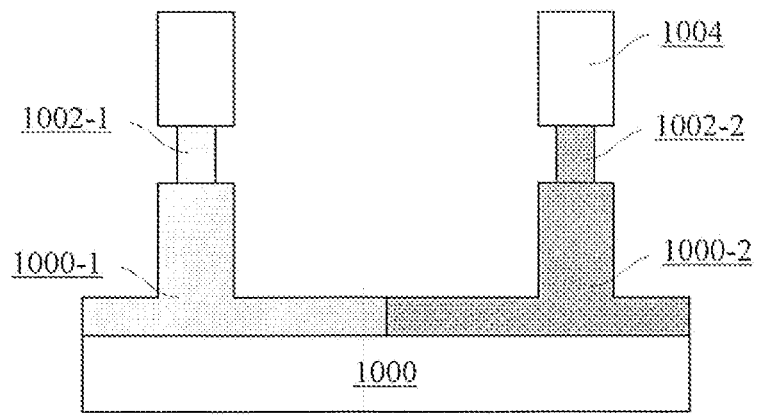

To reduce a parasitic capacitance at the bottom of finally-formed fins, the first semiconductor layer 1002 (such as SiGe) may be selectively etched with respect to the substrate 1000 and the second semiconductor layer 1004 (such as Si), so that the first semiconductor layer 1002 is recessed in a lateral direction, as shown in FIG. 5. Therefore, a portion of the initial fin that is constituted by the first semiconductor layer is narrowed.

After the fins having the lateral recesses are formed in the above process, gate stacks intersecting the fins may be formed to achieve final semiconductor devices.

To isolate the gate stacks from the substrate, an isolation layer may be formed on the substrate. This isolation layer may be formed by, for example, depositing a dielectric material on the substrate, and then etching it back, As such, the isolation layer will have a portion that fills the lateral recesses (of the first semiconductor layer) of the initial fins. In the back-etching, an etching depth may be controlled so that the back-etched dielectric material makes a portion of the first semiconductor layer protrude (relative to a top surface of the dielectric layer). That is, the isolation layer (except the portion filling the lateral recesses) has its top surface located beneath a top surface but above a bottom surface of the first semiconductor layer. In an example, the isolation layer may comprise High Density Plasma (HDP) oxide, such as silicon oxide.

Figure 6:
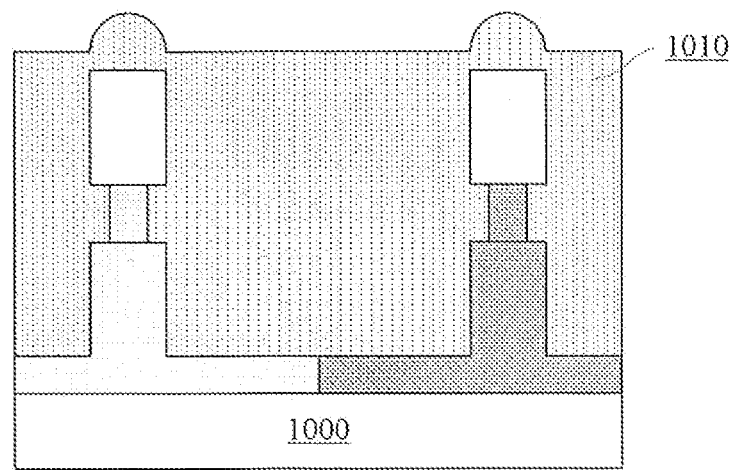

To improve uniformity in level of (the top surface of) the dielectric layer after being etched back, and thus improve uniformity in height of the finally-formed fins, the dielectric layer 1010 may be deposited in such a way that it substantially covers the initial fin (i.e., in case of multiple initial fins, substantially fills up gaps between the initial fins), as shown in FIG. 6. According to embodiments of the present disclosure, the dielectric layer may be deposited such that a portion of the dielectric layer on top of the initial fins has a thickness sufficiently less than that of a portion of the dielectric layer on the substrate. In general, the thickness of the portion of the dielectric layer on top of the initial fins is less than ⅓, preferably ¼, of the thickness of the portion of the dielectric layer on the substrate. In an example, the portion of the dielectric layer on top of each of the initial fins may have a thickness no more than 20 nm, and the portion of the dielectric layer on the substrate may have a thickness up to about 100 nm.

According to an example of the present disclosure, the dielectric layer 1010 may comprise oxide (e.g., silicon oxide) formed by High Density Plasma (HDP) deposition. Due to characteristics of HDP, the thickness of the dielectric layer on top of the initial fins (in a direction perpendicular to the substrate) and on side surfaces of the initial fins (in a direction parallel to the substrate, i.e., a lateral direction) is less than that of the dielectric layer between the initial fins on the substrate (in a direction perpendicular to the substrate) during the deposition. Due to such characteristics, the HDP deposition is conventionally not used to make oxide isolation.

Here, by controlling, for example, deposition conditions, the thickness of the portion of the dielectric layer 1010 on top of each of the initial fins may be less than ½ of a spacing between the initial fin and its neighboring initial fin when the dielectric layer 1010 substantially covers the initial fins (or substantially fills up the gaps between the initial fins). If spacings between the initial fins are not the same, the thickness of the portion of the dielectric layer 1014 on top of each of the initial fins may be less than ½ of a narrower one of the spacings between the initial fin and its neighboring initial fins.

Figure 7:
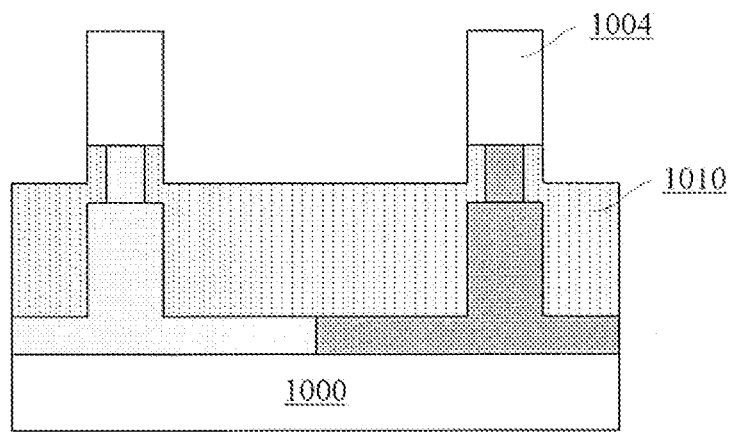

Next, the dielectric layer 1010 is etched back as shown in FIG. 7. As the back-etching of the dielectric layer 1010 is performed with a relatively small depth, it is relatively easy to control the etching, and it is thus possible to more accurately control a distance from the top surface of the fin (in this example, the top surface of the second semiconductor layer 1004) to the top surface of the isolation layer 1010 (which determines at least partially a fin height of the final device and thus a channel width of the final device), so that the distance is kept substantially constant across the substrate. In this way, the isolation layer may define the fins above the isolation layer. In an example where the first semiconductor layer 1002-1 and 1002-2 is doped as described above, it results in a threshold voltage higher than that in the second semiconductor layer 1004. Therefore, by controlling a gate control voltage, the second semiconductor layer may be conducted while the first semiconductor layer may not be conducted. As such, the fins used in the final devices may include only the second semiconductor layer 1004, and the first semiconductor layer 1002 may act as a punch-through stopper to prevent punch-through between source and drain.

Figure 8:
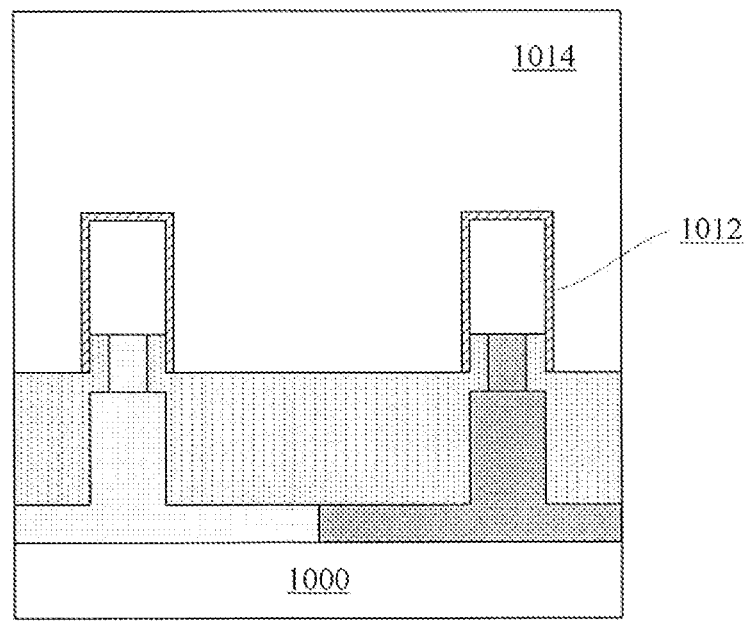

Then, gate stacks intersecting the respective fins may be formed on the isolation layer 1010. For example, this may be done as follows. In particular, as shown in FIG. 8, a gate dielectric layer 1012 may be formed through, for example, deposition. The gate dielectric layer 1012 may comprise, for example, oxide with a thickness of about 0.8-1.5 nm. Although the gate dielectric layer 1012 is shown in FIG. 8 as a shape of "Π," the gate dielectric layer 1012 may also include a portion extending onto the surface of the isolation layer 1010. Then, a gate conductor layer 1014 may be formed through, for example, deposition. The gate conductor layer 1014 may comprise, for example, polysilicon. The gate conductor layer 1014 may fill up the gaps between the fins, and may be planarized by, for example, Chemical Mechanical Polishing (CMP).

Figure 9:
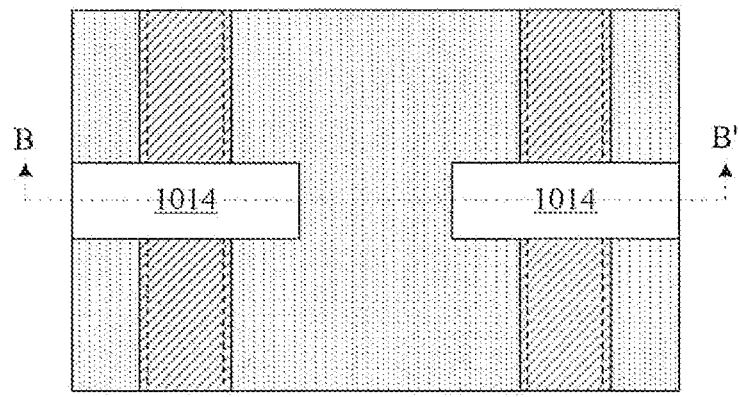
Figure 9:
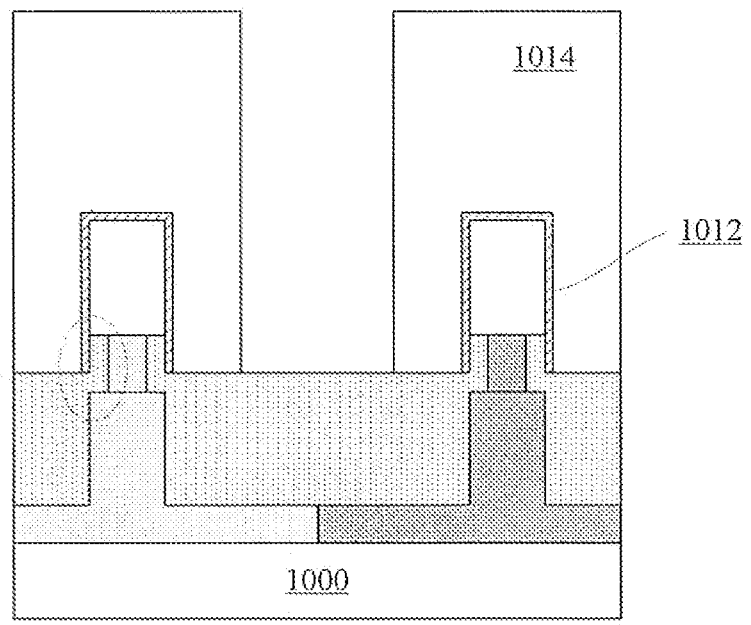

Next, as shown in FIG. 9 (FIG. 9(b) shows a cross-sectional view along line BB' in FIG. 9(a)), the gate conductor layer 1014 is patterned to form the gate stacks. The gate conductor layer 1014 is patterned into strips intersecting the respective fins in the example of FIG. 9. In another embodiment, the gate dielectric layer 1012 may be further patterned with the patterned gate conductor layer 1014 as a mask.

As denoted by a dotted-line ellipse in FIG. 9(b), the dielectric layer between the gate conductor 1014 and the fin is relatively thick at the bottom of the fin (the portion of the fin beneath the bottom is surrounded by the dielectric layer, and thus will not belong to a real fin in the final device where the channel is to be formed), resulting in a relatively small parasitic capacitance.

After forming the patterned gate conductor, halo implantation and extension implantation may be performed with the gate conductor as a mask, for example.

Figure 10:
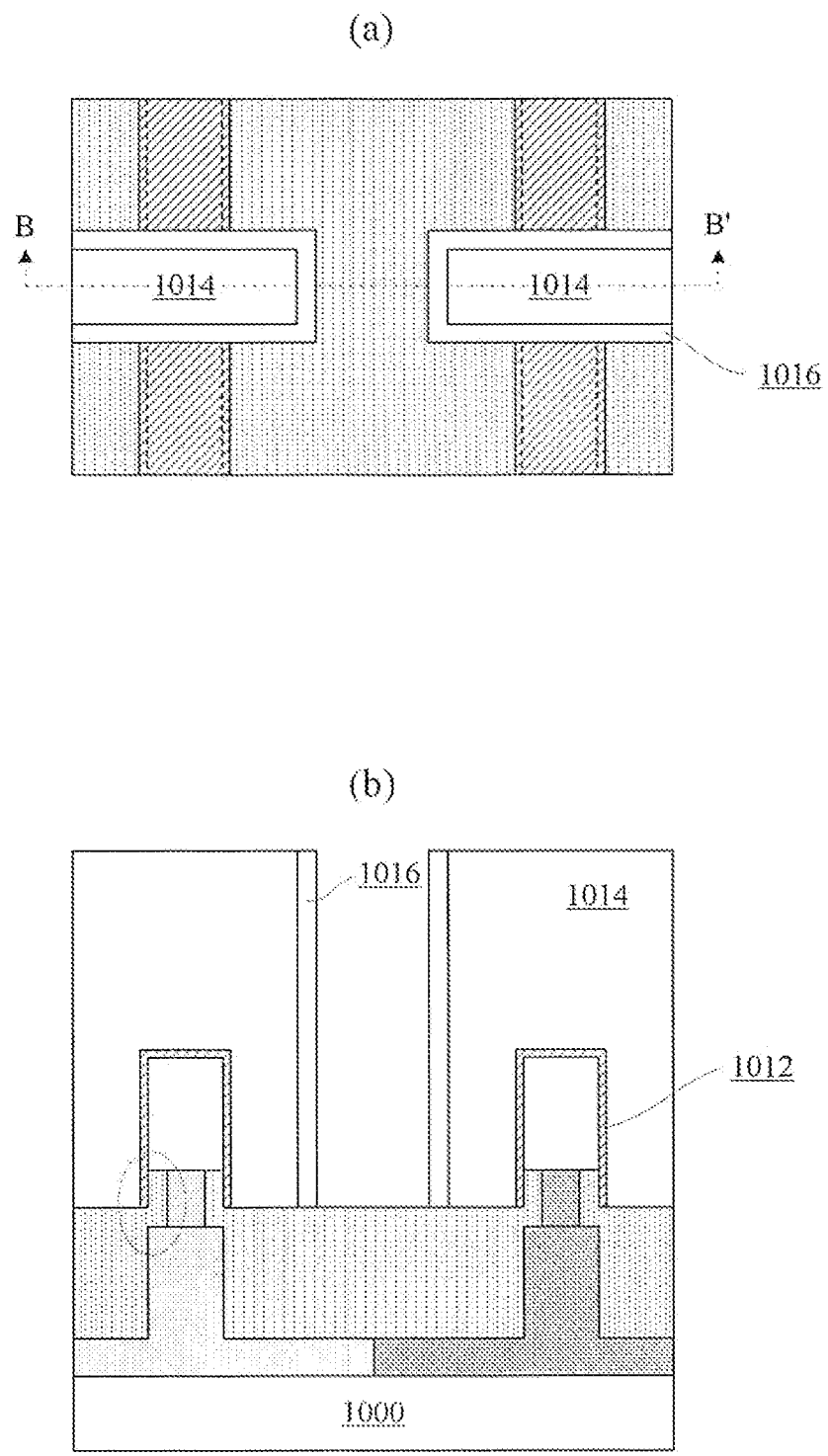

Next, as shown in FIG. 10 (FIG. 10(b) shows a cross-sectional view along line BB' in FIG. 10(a)), a spacer 1016 may be formed on side walls of the gate conductor layer 1014. The spacer 1016 may be formed by, for example, depositing a nitride layer with a thickness of about 5-30 nm, and then applying RIE on the nitride layer. There are various approaches for forming such a spacer, and details thereof will be omitted here.

After forming the spacer, source/drain (S/D) implantation may be performed with the gate conductor and the spacer as a mask. Then, the implanted ions may be activated through annealing to form source/drain regions, resulting in the semiconductor device of the embodiment. As shown in FIG. 10, the semiconductor device may comprise: the substrate; the patterned first and second semiconductor layers sequentially formed on the substrate, wherein the first semiconductor layer includes a lateral recess relative to the second semiconductor layer; the isolation layer formed on the substrate, having a portion that fills the lateral recess, wherein the isolation layer, except the portion that fills the lateral recess, has a top surface lower than a top surface of the first semiconductor layer but higher than a bottom surface of the first semiconductor layer, and thus defines a fin above the isolation layer; and the gate stack formed on the isolation layer and intersecting the fin. For a p-type device, the first semiconductor layer may be doped with n-type impurities, while for an n-type device, the first semiconductor layer may be doped with p-type impurities. Such a doped first semiconductor layer may act as a punch-through stopper.

In the above embodiment, the gate stacks are formed directly after the formation of the fins. The present disclosure is not limited thereto, and the gate last process is also applicable.

In a further embodiment of the present disclosure, the gate dielectric layer 1012 and the gate conductor layer 1014 formed in FIG. 8 may be a sacrificial gate dielectric layer and a sacrificial gate conductor layer, respectively. Subsequent processes may be performed in the way described above in conjunction with FIGS. 9 and 10.

Figure 11:
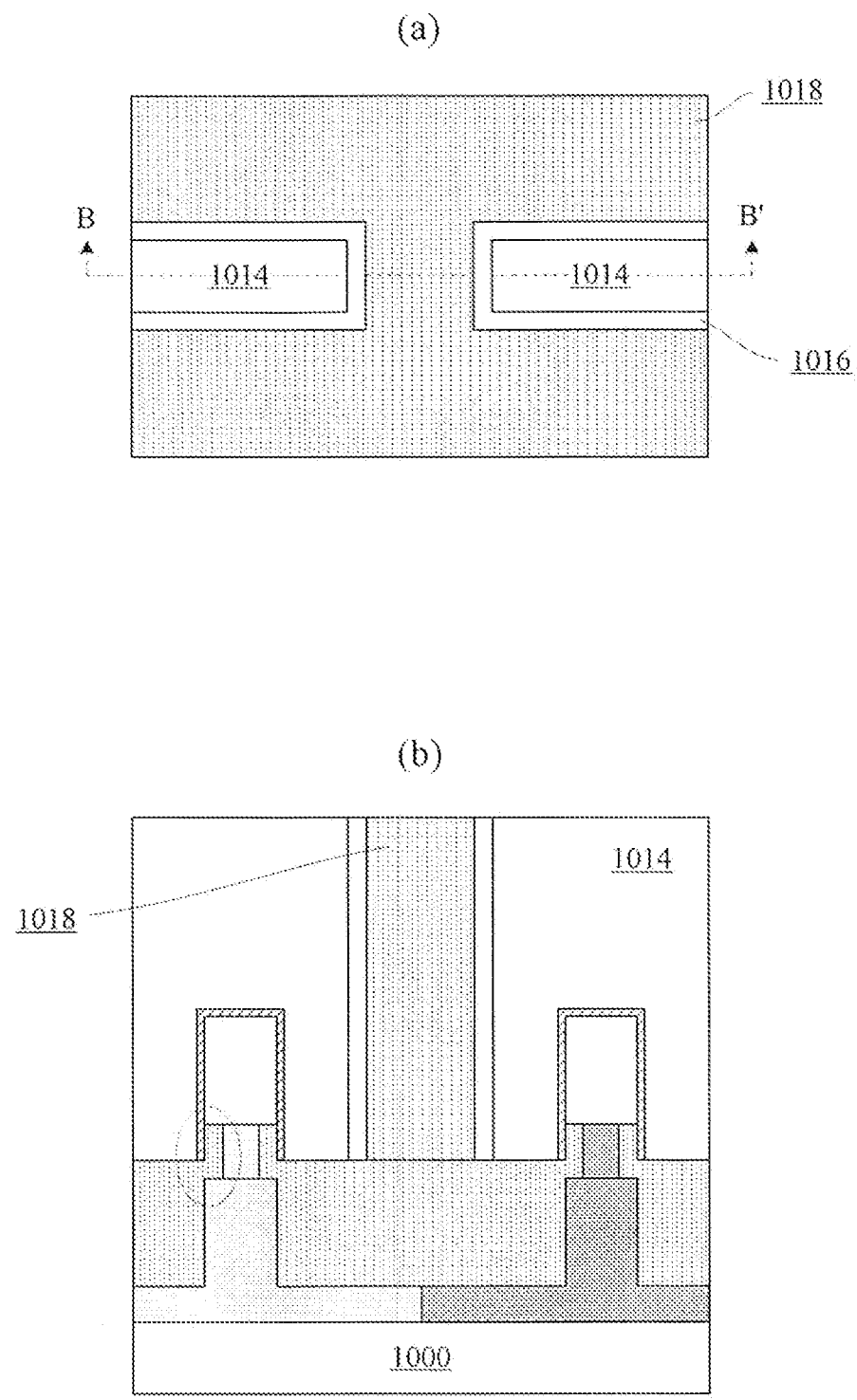

Next, as shown in FIG. 11 (FIG. 11(*b*) shows a cross-sectional view along line BB' in FIG. 11(*a*)), a further dielectric layer 1018 may be formed through, for example, deposition. The dielectric layer 1018 may comprise oxide, for example. Then, the dielectric layer 1018 is planarized by, for example, CMP, which may stop at the spacer 1016, thereby exposing the sacrificial gate conductor layer 1014.

Figure 12:
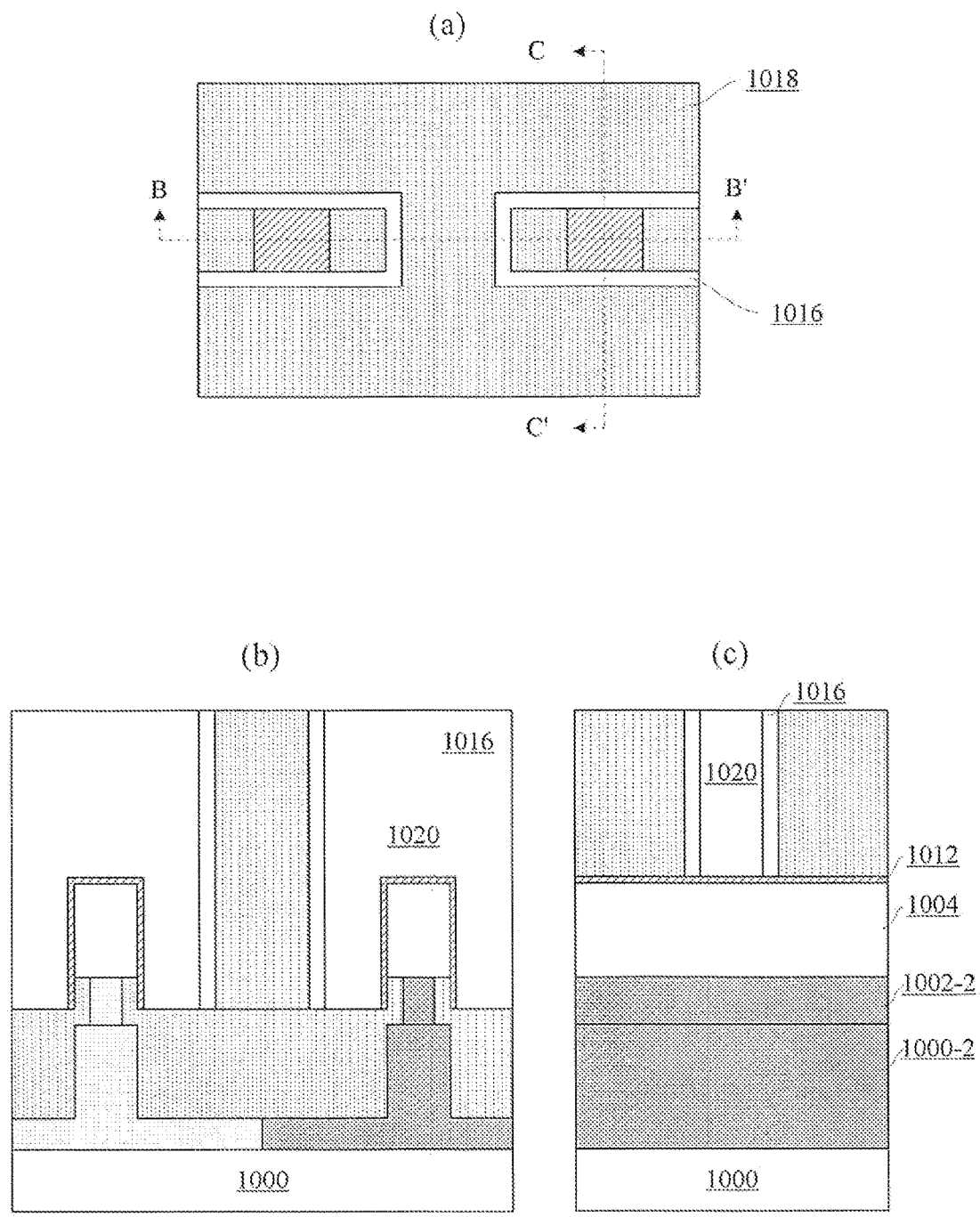

Subsequently, as shown in FIG. 12 (FIG. 12(*b*) shows a cross-sectional view along line BB' in FIG. 12(*a*), and FIG. 12(*c*) shows a cross-sectional view along line CC' in FIG. 12(*a*)), the sacrificial gate conductor layer 1014 may selectively removed by, for example, a TMAH solution, and thus a void 1020 is formed within the spacer 1016. In another example, the sacrificial gate dielectric layer 1012 may be further removed.

Figure 13:
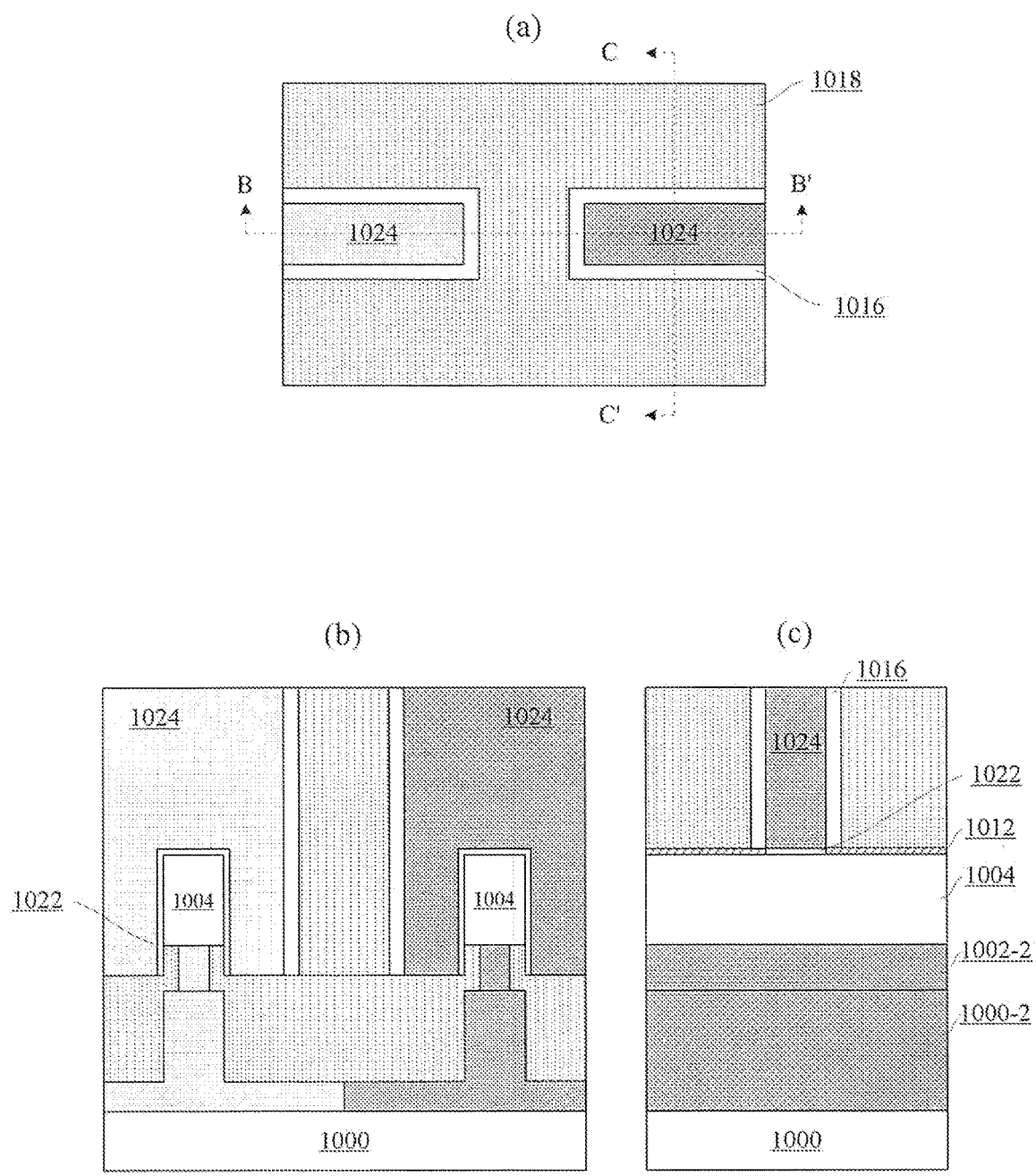

Next, as shown in FIG. 13 (FIG. 13(*b*) shows a cross-sectional view along line BB' in FIG. 13(*a*), and FIG. 13(*c*) shows a cross-sectional view along line CC' in FIG. 13(*a*)), a final gate stack is formed by forming a gate dielectric layer 1022 and a gate conductor layer 1024 in the void 1020. The gate dielectric layer 1022 may comprise a high-K gate dielectric, such as $HfO_2$, with a thickness of about 1-5 nm. The gate conductor layer 1024 may comprise a metal gate conductor. Further, a work function adjustment layer (not shown) may be formed between the gate dielectric layer 1022 and the gate conductor layer 1024.

Although the gate dielectric layer 1022 is shown in FIG. 13 as a thin layer at the bottom of the void 1020, the gate dielectric layer 1022 may be also formed on side walls of the void 1020 and thus surround the gate conductor layer 1024.

As such, the semiconductor device according to the embodiment is achieved. The structure of the semiconductor device is substantially the same as the semiconductor device of FIG. 10, except that the gate stack is formed in a different manner.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

The invention claimed is:

1. A semiconductor device, comprising:
a substrate;
first and second semiconductor layers stacked in a vertical direction on a substrate, wherein the first semiconductor layer has a lateral recess relative to the second semiconductor layer;
an isolation layer formed on the substrate, having a portion that fills the lateral recess, wherein the isolation layer, except the portion that fills the lateral recess, has a top surface lower than a top surface of the first semiconductor layer but higher than a bottom surface of the first semiconductor layer, and thus defines a fin above the isolation layer; and
a gate stack formed on the isolation layer and intersecting the fin, wherein the gate stack comprises a gate dielectric layer and a gate conductor layer,
wherein said portion of the isolation layer has a first surface extending in the vertical direction and facing and contiguous to the first semiconductor layer, and also a second surface, opposite to the first surface, extending in the vertical direction and facing and contiguous to the gate dielectric layer.

2. The semiconductor device according to claim 1, wherein the substrate comprises bulk Si, the first semiconductor layer comprises SiGe, and the second semiconductor layer comprises Si.

3. The semiconductor device according to claim 1, wherein the first semiconductor layer is doped with n-type impurities for a p-type device, or is doped with p-type impurities for an n-type device.

4. The semiconductor device according to claim 1, wherein the semiconductor device comprises a plurality of fins, wherein the fins have their respective top surfaces substantially flushed with each other, and the isolation layer has a substantially flat top surface.

5. The semiconductor device according to claim 1, wherein the isolation layer comprises oxide.

6. The semiconductor device according to claim 1, wherein the gate dielectric layer comprises a high-K gate dielectric layer and wherein the gate conductor layer comprises a metal gate conductor layer.

* * * * *